United States Patent
Kondo et al.

(10) Patent No.: US 6,621,372 B2
(45) Date of Patent: Sep. 16, 2003

(54) IMPEDANCE MATCHING DEVICE

(75) Inventors: Kazuki Kondo, Wakayama (JP); Daisuke Matsuno, Kobe (JP); Eiji Kaneko, Ibaraki (JP); Koji Itadani, Sanda (JP)

(73) Assignee: Daihen Corporation, Osaka (JP)

( * ) Notice: Subject to any disclaimer, the term of this patent is extended or adjusted under 35 U.S.C. 154(b) by 0 days.

(21) Appl. No.: 10/085,861

(22) Filed: Feb. 27, 2002

(65) Prior Publication Data
US 2002/0163398 A1 Nov. 7, 2002

(30) Foreign Application Priority Data

Mar. 1, 2001 (JP) ................................. P.2001-056680
Jan. 24, 2002 (JP) ................................. P.2002-015495

(51) Int. Cl.[7] ............................................. H03H 7/38
(52) U.S. Cl. ...................... 333/35; 333/17.3; 333/32; 333/99 PL
(58) Field of Search ...................... 333/35, 17.3, 32, 333/99 PL

(56) References Cited

U.S. PATENT DOCUMENTS 4,229,826 A * 10/1980 Wanzer ........................ 455/83
4,570,134 A * 2/1986 Woodward .................. 333/123
4,679,007 A * 7/1987 Reese et al. ................. 333/17.3
5,815,047 A * 9/1998 Sorensen et al. ........... 333/17.3
5,952,896 A   9/1999 Mett et al.

* cited by examiner

Primary Examiner—Patricia Nguyen
(74) Attorney, Agent, or Firm—Jordan and Hamburg LLP

(57) ABSTRACT

In an impedance matching device having at least two stubs serially provided to a main coaxial tube so as to be separated from each other with a predetermined interval in a tube axial direction, each stub is composed of a variable capacity capacitor to be jointed to an inner conductor of the main coaxial tube, an electrically conductive capacitor cover to be jointed to an outer conductor of the main coaxial tube so as to cover a surrounding of the variable capacity capacitor, and a drive motor arranged on an outside of the capacitor cover so as to drive a movable side electrode of the variable capacity capacitor. The movable side electrode of the variable capacity capacitor is driven directly by the drive motor so that the impedance matching device is made to be compact and response of impedance matching to a fluctuation of a load impedance such as a behavior of a plasma load is improved, and the life is lengthened and degrees of freedom of installation is widened.

3 Claims, 6 Drawing Sheets

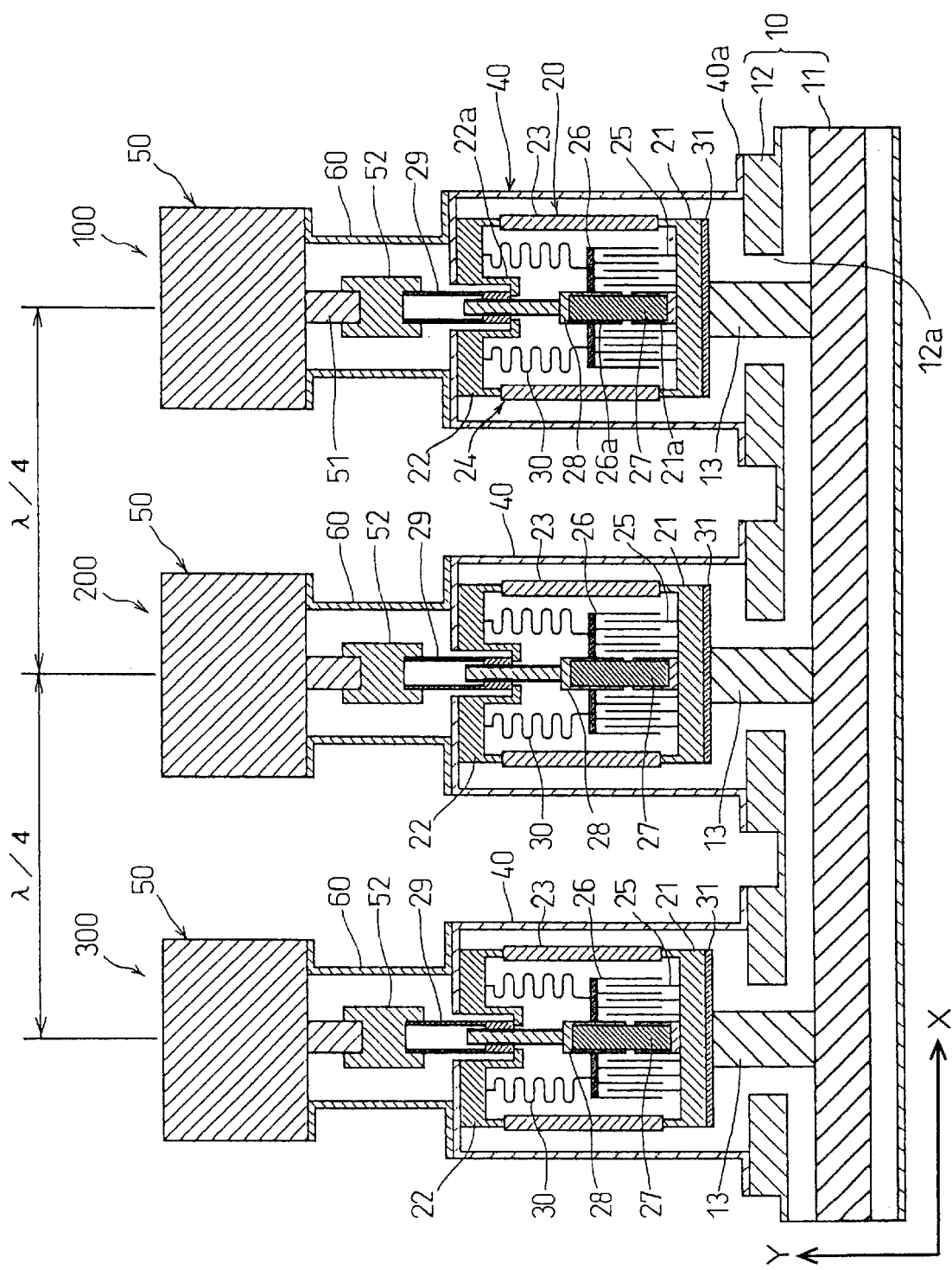
F I G. 1

IMPEDANCE MATCHING DEVICE

BACKGROUND OF THE INVENTION

1. Field of the Invention

The present invention relates to an impedance matching device used for a plasma dry process for production of a semiconductor and the like. Particularly, the invention relates to a technique which improves response to a fluctuation of a load impedance. The impedance matching device intervenes, for example, in a transmission path of a high-frequency power between a high-frequency power supply and a load of a plasma chamber or the like. An impedance of the transmission path is matched with an impedance of the load so that reflection of a power from the load is eliminated, and an incident power from the high-frequency power supply is utilized on the load side most efficiently.

2. Description of the Related Art

In a plasma dry process for production of a semiconductor, in recent years, a frequency of a high-frequency power to be used is heightened from an RF band (up to 30 MHz) to a VHF band (30 to 300 MHz) and further to an UHF band (300 MHz to 3 GHz) in order to fine a substrate pattern of a semiconductor element. It is an impedance matching device to supply such a high-frequency power efficiently to a load of a plasma chamber or the like.

The impedance matching device which intervenes in a middle of a transmission path, such as a coaxial tube and a waveguide, of a high-frequency power has a plurality of stubs respectively in positions separated from one another in an axial direction of the tube. A distance of the adjacent stubs is ¼ of a tube inner wavelength $\lambda g$ in the coaxial tube in a frequency of the high-frequency power to be applied.

A plunger type stub has a variable length coaxial tube in which a conductor portion and an outer cylinder portion are provided concentrically, an end short-circuiting electrode which slides in the variable length coaxial tube along the axial direction. In order to make it possible to carry out impedance matching over a wide area of Smith's chart, a sliding range of the end short-circuiting electrode is generally set to $\lambda g/4$. Moreover, an entire length of the stub is not less than $\lambda g/2$.

The entire length of the stub is supposed to be shortened to about $\lambda g/4$ by eliminating a protruding operation of the plunger and allowing the end short-circuiting electrode to slide in a reciprocating way by means of a wire.

However, in this case, it is necessary to bring each end short-circuiting electrode into close contact with each conductor portion and outer cylinder portion in each stub, and thus frictional resistance of sliding is large. Moreover, since the impedance matching is carried out by adjusting the length of the tube path according to displacement of each end short-circuiting electrode, the entire length of each stub is fairly long, and their accuracy of axial center is low.

Due to the large sliding resistance and the low accuracy of the axial center, a moving speed of the plunger becomes slow, and thus response of the impedance matching to a fluctuation of a load impedance is not good. Further, due to the large frictional resistance of sliding, the end short-circuiting electrode, the outer cylinder portion of each stub, abrasion and deterioration of each conductor portion easily proceed in the long time use, and this decreases the life.

Furthermore, since it is difficult to use the long stub in a laid posture, the impedance matching device is installed in an upright posture, but this occupies a large space of a room in a height-wise direction, and this interferes the installation.

SUMMARY OF THE INVENTION

Therefore, a main object of the present invention is to provide an impedance matching device which is capable of being compact and improving response of impedance matching to a fluctuation in a load impedance such as a behavior of a plasma load.

Another object of the present invention is to provide an impedance matching device which is capable of lengthening its life and widening degrees of freedom of installation.

Still another objects, characteristics and advantages of the present invention will become apparent by the following description.

The impedance matching device of the present invention solves the problems mentioned above by taking the following measures.

The impedance matching device according to the present invention includes a plurality of stubs which are provided to a main coaxial tube so to be separated from one another in a premised structure. As for the main coaxial tube, an opening of one end in the tube axial direction is connected to a high-frequency power supply side and an opening of the other end in the tube axial direction is connected to a load side of a plasma chamber and the like. The stubs are serially provided to at least two places of the main coaxial tube separated by a predetermined interval in the tube axial direction in a branch state. In this premised structure, the opening of one end of the main coaxial tube may be connected directly to the high-frequency power supply or connected to the coaxial tube extended from the high-frequency power supply. Moreover, the opening of the other end of the main coaxial tube may be connected directly to the load or connected to the coaxial tube extended from the load. A number of stubs to be provided is preferably three in general, but may be two or not less than four. Directivity of the stubs is normally vertical with respect to the tube axial direction of the main coaxial tube but is not necessarily to be always limited to this. If a stub is extended obliquely, its essentiality does not change. A providing interval of a plurality of stubs is generally and preferably ¼ of a tube inner wavelength $\lambda g$, but since the interval is not a characteristic itself in the present invention, it is not particularly limited.

According to the present invention, the impedance matching device having the above structure as the premise is characterized by including the following requisites. In other words, each of the plurality of stubs includes a variable capacity capacitor whose one end is to be jointed to an internal conductor of the main coaxial tube, and an electrically conductive capacitor cover to be jointed to an outer conductor of the main coaxial tube so as to be electrically joined to the other end of the variable capacity capacitor as well as to cover a surrounding of the variable capacity capacitor. Further, each stub includes a drive motor which is arranged on an outside of the capacitor cover so as to drive a movable side electrode of the variable capacity capacitor.

The impedance matching device of the present invention executes impedance matching by adjusting an electrostatic capacity of the variable capacity capacitor, unlike a plunger type impedance matching device which executes impedance matching by adjusting a length of a tube path in a stub in accordance with a displacement of an end short-circuiting electrode (short plunger). Unlike the adjustment of the length of the tube path, the adjustment of the electrostatic capacity has large degrees of freedom of space. In the case of the plunger system, the adjustment of the length of the tube path is limited to a relationship of 1:1 in the displacement in the axial direction. In other words, an adjustment amount of the length of the tube path is completely equal with a displacement amount of the end short-circuiting electrode in the axial direction. However, in the case of the adjustment of the electrostatic capacity, for example, cylindrically-shaped movable side electrode and fixed side electrode are inwardly and outwardly fitted to each other so as to form a multiplayer so that the electrostatic capacity can be increased or decreased in a state that the displacement of the movable side electrodes is amplified. Namely, the electrostatic capacity can be changed relatively greatly by comparatively small displacement. Therefore, a moving amount of the movable side electrode for the impedance matching in accordance with a fluctuation of the load impedance may be small. Time required for moving the movable side electrode by a predetermined amount can be shortened in comparison with the plunger system, thereby making it possible to realize high-speed response of the impedance matching.

In the case of the adjustment of the length of the tube path, the end short-circuiting electrode should closely contact with a conductor portion and an outer cylinder portion of the stub so as to slide, but in the case of the adjustment of the electrostatic capacity, such closely contact sliding is not always necessary. Resistance at the time of the displacement of the movable side electrode is reduced greatly, and this is also advantageous to the high-speed response of the impedance matching.

The movable side electrode of the variable capacity capacitor is driven directly by the drive motor arranged on the outside of the capacitor cover. Namely, a reduction mechanism does not intervene, and this is more advantageous to the high-speed response.

In addition, the movable side electrode can be displaced smoothly without resistance, and this is advantageous also to reduce abrasion and lengthen the life.

Since a stroke of the movable side electrode of the variable capacity capacitor can be shortened, a length of the stub itself can be short. It is possible to heighten accuracy of axial center. This high accuracy of the axial center is advantageous to the smooth movement of the movable side electrode and, as a result, advantageous to improve the high-speed response.

Since the stub is short and its accuracy of axial center is high, a posture of the stub is not always limited to an upright posture. For example, the impedance matching device can be installed in a posture that the stubs are laid. Namely, degrees of freedom of the installation becomes high.

An example of the preferable form in the impedance matching device having the above structure is the following structure. Namely, the impedance matching device is designed based on a susceptance of the stubs having the movable capacity capacitance including the electrically conductive capacitor cover which is calculated according to the following formula:

$$B_x = \frac{\omega C_x}{1 - \omega^2 C_x L_x} \quad (1)$$

(where, $B_x$ is the susceptance, $L_x$ is a parasitic inductance, $C_x$ is the electrostatic capacity of the variable capacity capacitor, and $\omega$ is a use angular frequency).

When the variable capacity capacitor reaches a high-frequency range, a level of the parasitic inductance of its internal structural element, particularly bellows and wiring cannot be ignored. Actually, it was found that this disabled the variable capacity capacitor from sufficiently displaying a function as a variable capacity element.

When a complex inductance Z is expressed by a resistance R and a reactance X, the following formula holds:

$$Z = R + jX \quad (2)$$

When a complex admittance Y is expressed by a conductance G and a susceptance B, the following formula holds:

$$Y = G + jB \quad (3)$$

where, $$G = \frac{R}{R^2 + X^2} \quad (4)$$

$$B = -\frac{X}{R^2 + X^2} \quad (5)$$

Here, when the resistance R is 0 (R=0), the following formula holds:

$$B = -\frac{1}{X} \quad (6)$$

An electrostatic capacity of the variable capacity capacitor according to a displacement amount x from a reference point is represented by Cx. The following formula holds for the reactance X:

$$X = -\frac{1}{\omega C_x} \quad (7)$$

Therefore, the following formula holds for the susceptance B:

$$B = \omega C_x \quad (8)$$

The electrostatic capacity Cx is proportional to the displacement amount x from the reference point. When its proportional constant is represented by kc, the following formula holds:

$$C_x = kc \cdot x \quad (9)$$

Therefore, when the susceptance B is supposed to be in accordance with the displacement amount x and a symbol Bx is used, the following formula holds:

$$B_x = \omega kc \cdot x \quad (10)$$

This characteristic curve becomes linear.

The above is adopted to the case where the frequency of the high-frequency power to be used is comparatively low. However, it was found that as the frequency of the high-frequency power became higher, the following problem arose.

In the high-frequency range, the bellows and wiring in the variable capacity capacitor (vacuum capacitor) have parasitic inductance, and its level cannot be ignored. In addition, the capacitor cover which houses the variable capacity capacitor and the wiring have fixed inductance.

Particularly in the frequency of UHF band, the frequency passes a serial resonance point of an LC circuit so that the variable capacity capacitance looses its function and functions as a variable inductor. The variable capacity capacitor in the high-frequency range is considered as a model of a serial resonance circuit having capacitance Cx and inductance Lx of which values change according to the displacement amount x with respect to the reference point. Reactance Xx of the serial resonance circuit becomes as follows:

$$X_x = \omega L_x - \frac{1}{\omega C_x} \quad (11)$$

When R=0, a susceptance Bx becomes as follows:

$$B_x = -\frac{1}{X_x} = \frac{\omega C_x}{1 - \omega^2 L_x C_x} \quad (12)$$

Where, $\omega = 2\pi f$.

Here, due to UHF band, $\omega L_x$ becomes very large as represented by the following formula:

$$1 << \omega^2 L_x C_x \quad (13)$$

and the susceptance Bx obtains a minus value.

Here, since Bx always has a minus value, the stub can be called as a variable inductance element. Therefore, the following formula holds:

$$B_x = -\frac{1}{\omega L'} \quad (14)$$

Here, when L' is inductance when the stub is the variable inductance element, Bx<0 because L'>0, L' becomes as follows according to the formula (13):

$$L' = -\frac{\omega^2 L_x C_x - 1}{\omega^2 C_x}$$
$$= L_x - \frac{1}{\omega C_x} \quad (15)$$

An electrostatic capacity Cx of the variable capacity capacitor is subtracted from the parasitic inductance Lx. In the high-frequency range, in order to prevent the stub from resonating, the variable capacity capacitor determines the level of the parasitic inductance Lx of its internal structural element, particularly, the bellows and wiring so that they become as follows:

$$L_x > \frac{1}{\omega C_x} \quad (16)$$

In the high-frequency range, it is important to design the variable capacity capacitor and the capacitor cover so that the entire parasitic inductance always has a plus value in a variable range of the variable capacity capacitor.

BRIEF DESCRIPTION OF THE DRAWINGS

These and other objects as well as advantages of the invention will become clear by the following description of preferred embodiments of the invention with reference to the accompanying drawings, wherein:

FIG. 1 is a cross sectional view showing a structure of an impedance matching device according to a preferred embodiment of the present invention;

In all these figures, like components are indicated by the same numerals.

DETAILED DESCRIPTION OF PREFERRED EMBODIMENTS

There will be detailed below preferred embodiments of an impedance matching device of the present invention with reference to the drawings.

In FIG. 1 showing a cross sectional view of the impedance matching device, a direction at right angles to a direction X as a tube axial direction of a main coaxial tube 10 is a direction Y, but this direction Y is assumed to be a horizontal direction. However, the direction Y may be an up-down direction or may be another arbitrary directions.

Figure 2:
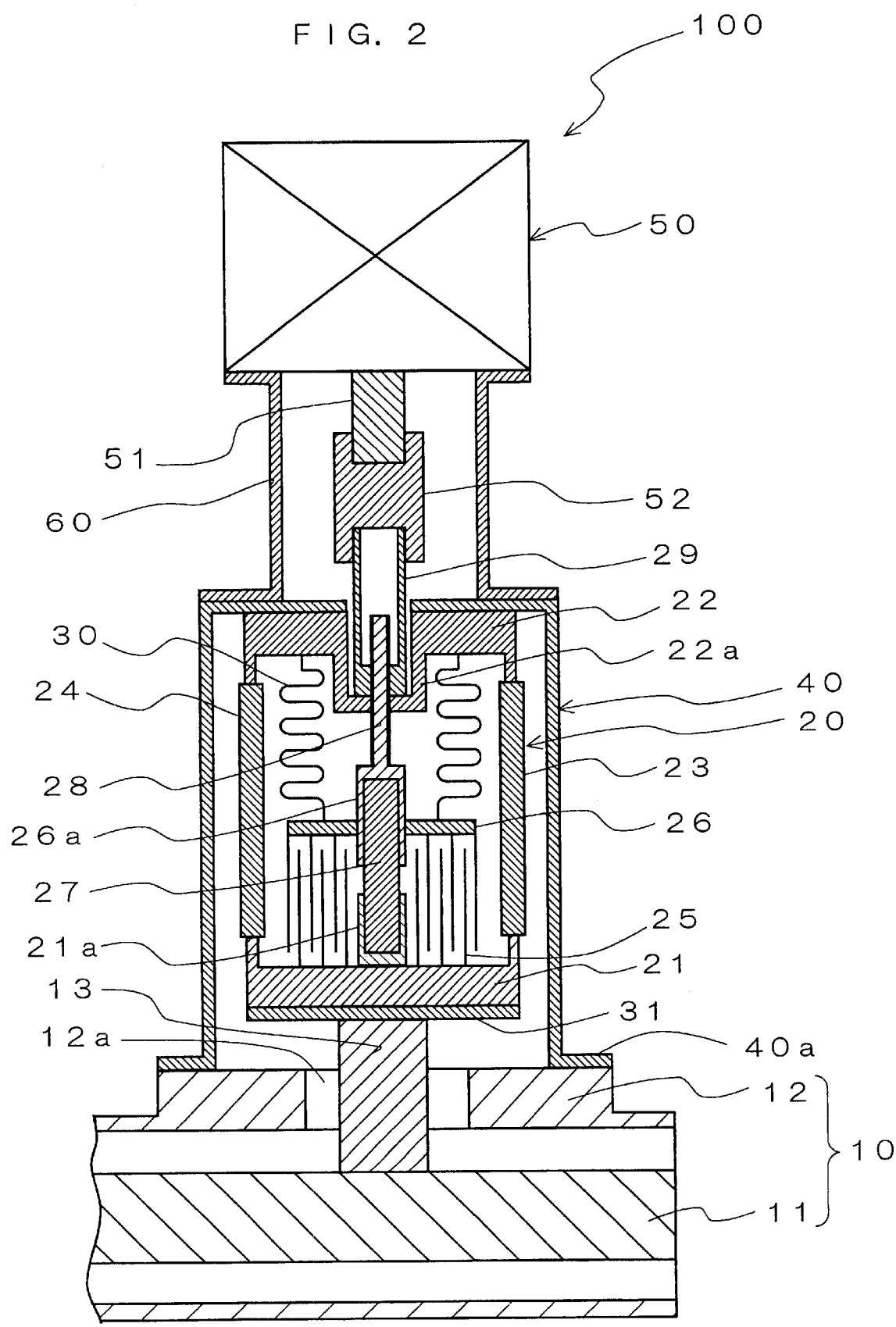
FIG. 2 is a cross sectional view showing one enlarged stub in FIG. 1.

The main coaxial tube 10 is composed of a main coaxial tube inner conductor 11 and a main coaxial tube outer conductor 12. The main coaxial tube outer conductor 12 is outwardly fitted to an outer periphery of the main coaxial tube inner conductor 11 concentrically with predetermined intervals. An coaxial tube inner wavelength of a frequency of a power to be applied is $\lambda g$. Stubs 100, 200 and 300 are attached to the main coaxial tube outer conductor 12 in three places separated from one another by $\lambda g/4$ in a tube axial direction of the main coaxial tube 10. The three stubs 100, 200 and 300 have the same structure. Here, the explanation will be given only as for the stub 100. The structure of the stub 100 is enlarged in FIG. 2.

The stub 100 is composed of a variable capacity capacitor 20, an electrically conductive capacitor cover 40 and a drive motor 50. A branch inner conductor 13 is jointed at right angles to the main coaxial tube inner conductor 11 and passes through a through hole 12a formed on the main coaxial tube outer conductor 12 so as to be extended to the outside. The variable capacity capacitor 20 is fixed to the extended end portion of the branch inner conductor 13. The capacitor cover 40 is outwardly fitted to the outer periphery of the variable capacity capacitor 20 with a predetermined interval. The capacitor cover 40 is jointed to the outer peripheral surface of the main coaxial tube outer conductor 12. The drive motor 50 is attached to an end board portion of the capacitor cover 40 via a motor supporting flange 60. The electrically conductive capacitor cover 40 is made of a material such as copper, aluminum or brass. Moreover, the jointing of the branch inner conductor 13 and the main coaxial tube inner conductor 11, and the jointing of the capacitor cover 40 and the main coaxial tube outer conductor 12 may be made to be serially integral by welding or bonding means. Alternatively, they are joined by tightening means such as a bolt in a separable state.

There will be explained below the structure of the variable capacity capacitor 20. In the case of this embodiment, the variable capacity capacitor 20 is composed of a vacuum capacitor as a typical example in order to allow a large power. As for the variable capacity capacitor 20, a fixed side electrode end board portion 21 on one end of the axial direction, a movable side electrode end board portion 22 on the other end of the axial direction, and an insulating cylinder 23 made of ceramic or the like for connecting the fixed side electrode end board portion 21 and the movable side electrode end board portion 22 facing each other in the axial direction compose an outer shell 24. Inside the outer shell 24, a fixed side electrode 25 is fixed to the fixed side electrode end board portion 21. A movable side electrode 26 is outwardly and inwardly fitted to the fixed side electrode 25 slidably along the axial direction.

As for the fixed side electrode 25, a plurality of cylinders are arranged concentrically. As for the movable electrode 26, a plurality of cylinders which are inwardly and outwardly fitted to the plurality of cylinders composing the fixed side electrode 25 are arranged concentrically. As for the inward and outward fitting of this multi-layer, the plurality of cylinders of the fixed side electrode 25 and the plurality of cylinders of the movable side electrode 26 are countered to one another radially with predetermined intervals. The structure, that the fixed side electrode 25 and the movable side electrode 26 are inwardly and outwardly in the multi-layered state, forms an electrostatic capacity. The electrostatic capacity is varied by sliding of the movable side electrode 26 along the axial direction with respect to the fixed side electrode 25.

A center pin 27 made of ceramic or the like is fitted slidably so as to be across between a guide cylinder 21a provided on an axial center of the fixed side electrode end board portion 21 and a movable lead 26a provided on an axial center of the movable side electrode 26. This structure heightens accuracy of the axial center and thus makes the sliding of the movable side electrode 26 along the axial direction with respect to the fixed side electrode 25 smooth and accurate.

An adjustment bolt 28 is provided integrally with the movable lead 26a which is jointed integrally to the movable side electrode 26. A concavity 22a is formed on an axial center of the movable side electrode end board portion 22. The adjustment bolt 28 inward and outward passes in the axial direction through a thorough hole formed on an axial center of the concavity 22a. An external thread is formed on an outer peripheral portion of the adjustment bolt 28, and an internal thread of an electrostatic capacity adjustment cylinder shaft 29 is screwed into the external thread. A thrust bearing (not shown) is put between the electrostatic capacity adjustment cylinder shaft 29 and the concavity 22a of the movable side electrode end board portion 22. Inside the outer shell 24, bellows 30 are provided across between the movable side electrode end board portion 22 and the movable side electrode 26 stretchably in the axial direction so as to surround the adjustment bolt 28. The bellows 30 are made of a conductor and electrically connects the movable side electrode 26 to the movable side electrode end board portion 22. Moreover, the bellows 30 serves also to tighten the movable side electrode 26 and the adjustment bolt 28.

As for the variable capacity capacitor 20 having the above structure, its fixed side electrode end board portion 21 is jointed to the branch inner conductor 13 via a capacitor attachment board 31. Moreover, in a state that the electrostatic capacity adjustment cylinder shaft 29 is put through the through hole on the axial center of the end board of the capacitor cover 40, the capacitor cover 40 covers the variable capacity capacitor 20. An end board inner surface of the capacitor cover 40 is jointed to the movable side electrode end board portion 22 of the variable capacity capacitor 20.

A flange 40a on a base portion of the capacitor cover 40 is fixed to the outer peripheral surface of the main coaxial tube outer conductor 12. The capacitor cover 40 connects the movable side electrode end board portion 22 to the main coaxial tube outer conductor 12 in a conductive state. The capacitor attachment board 31 should be made of metal in order to electrically conduct the branch inner conductor 13 and the capacitor 20. Moreover, the jointing of the branch inner conductor 13 and the fixed side electrode end board portion 21 and the jointing of the movable side electrode end board portion 22 and the capacitor cover 40 may be made to be serially integral with each other by welding or bonding means. Alternatively, they may be connected by fastening means such as a bolt in a separable state.

The electrostatic capacity adjustment cylinder shaft 29 of the variable capacity capacitor 20 which is projected from the capacitor cover 40 and a drive shaft 51 of the drive motor 50 face each other coaxially. In this state, the drive shaft 51 and the electrostatic capacity adjustment cylinder shaft 29 are directly connected to each other via a coupling 52 without intervention of a reduction mechanism. The motor supporting flanges 60 are allowed to intervene between the drive motor 50 and the capacitor cover 40 so as to cover the drive shaft 51, the coupling 52 and the electrostatic capacity adjustment cylinder shaft 29. An encoder (not shown) is provided to the drive motor 50 and this encoder monitors a drive state of the drive motor 50.

Here, the explanation as to the structure of the stub 100 is ended, but the stubs 200 and 300 have the same structure.

Figure 3:
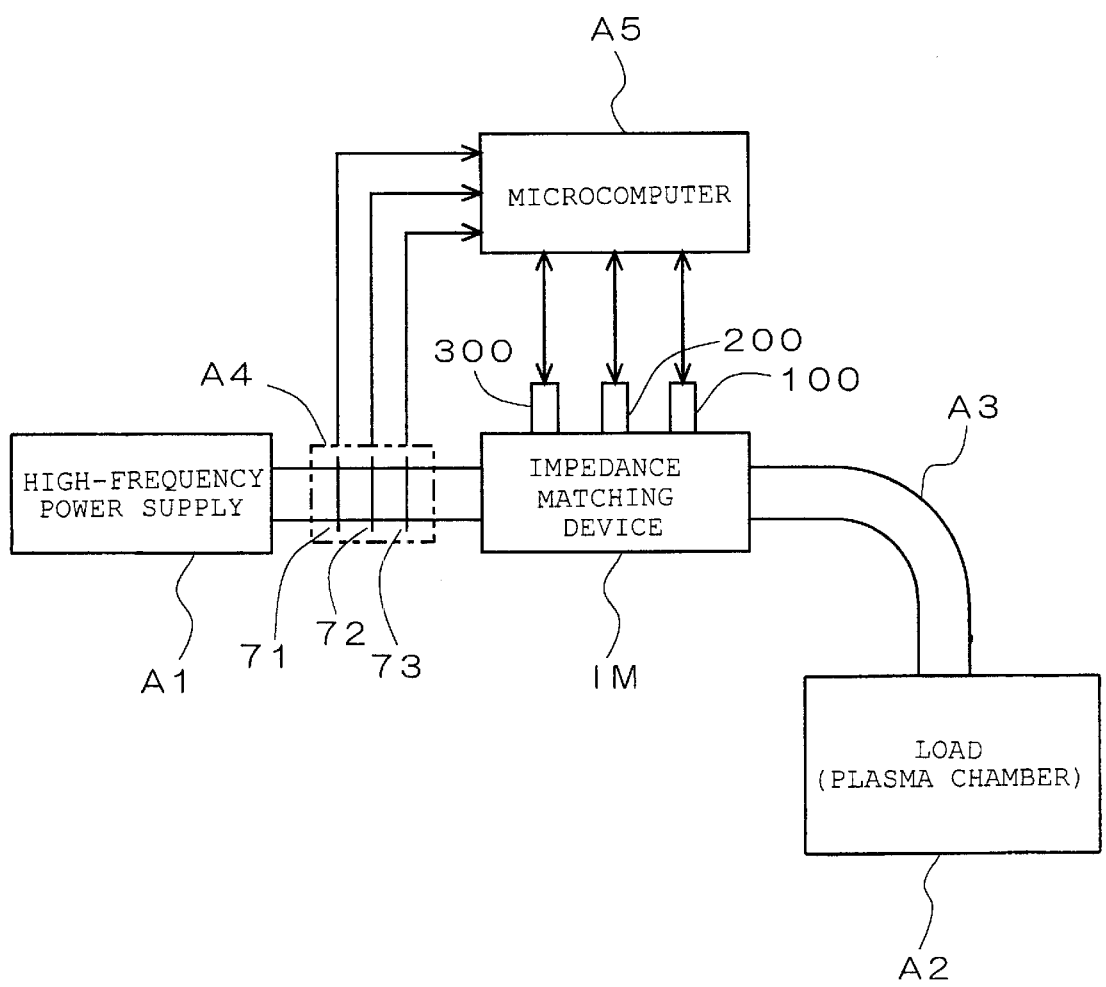
FIG. 3 is a schematic diagram showing a state that the impedance matching device of the above embodiment is used in a plasma dry process for production of a semiconductor.

FIG. 3 shows a state that the impedance matching device is used in a plasma dry process or the like for production of a semiconductor. The impedance matching device IM and an antenna device A4 are provided in this order from a load A2 side to a middle of a coaxial tube (a wave guide) A3 which connects the high-frequency power supply A1 and the load A2. A typical example of the load A2 can be a process chamber in a semiconductor producing apparatus. The antenna device A4 is composed of three antennas 71, 72 and 73 which are provided on three places in a tube axial direction in the coaxial tube A3. The antenna device detects a voltage standing wave amplitude in the coaxial tube A3 and transmits its detection signals to a microcomputer A5. The microcomputer A5 calculates a reflection coefficient and a phase in the coaxial tube A3 based on the received three detection signals and coverts them into values viewed from the positions of the stubs 100, 200 and 300 so as to calculate a stub necessary for impedance matching and its adjustment amount. Data are captured once per about 1 msec, and the adjustment amount of the stub is corrected based on the latest data.

A direction from the microcomputer A5 drives to rotate each drive motor 50 in the stubs 100, 200 and 300. Each drive motor 50 and each variable capacity capacitor 20 are directly connected by each coupling 52 without a reduction mechanism. Therefore, the operating speed of the movable side electrodes 26 in the variable capacity capacitor 20 due to the rotation of the drive motors 50 is heightened. In other words, the high-speed drive in the impedance matching is possible. The microcomputer A5 monitors the encoders (not shown) of the drive motors 50 so as to control the drive motors 50.

As for each electrically conductive capacitor cover 40 which covers each variable capacity capacitor 20, when each variable capacity capacitor 20 is driven in a UHF band frequency (for example, 450 MHz), each capacitor cover 40 serves as an inductor (L) and each capacitor cover 40 and each variable capacity capacitor 20 form an LC series circuit.

As for the UHF band frequency, the variable capacity capacitor 20 once passes through a series resonance point of LC and does not serve as the variable capacitance capacitor 20 but serves as a variable inductor due to its properties. Namely, in the series resonance circuit, the large fixed inductor L (parasitic inductor) is canceled by an electrostatic capacity of the capacitor C composed of the fixed side electrode 25 and the movable side electrode 26.

Figure 4:
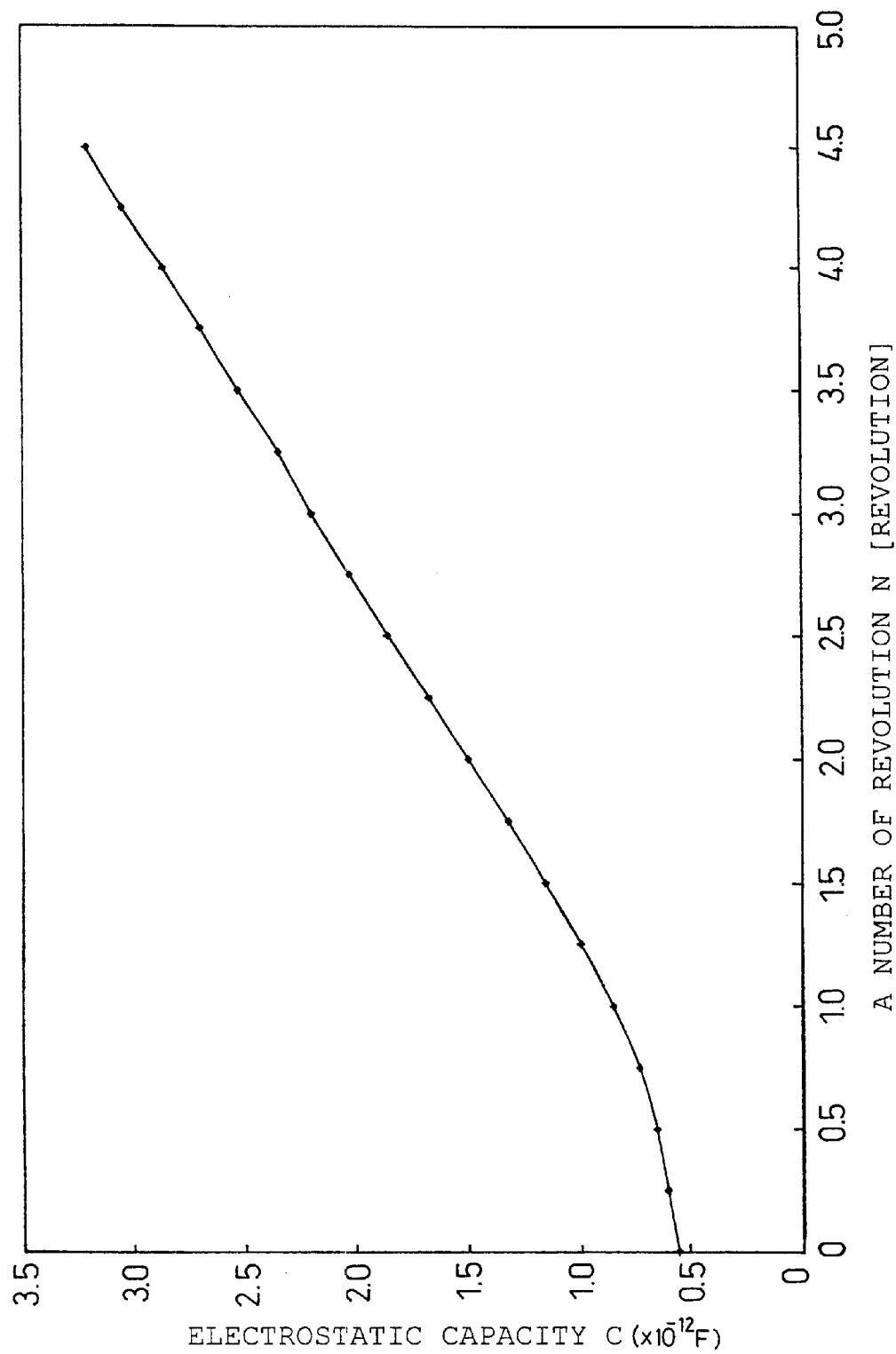
FIG. 4 is an electrostatic capacity table showing a relationship between a number of revolution and an electrostatic capacity of a variable capacity capacitor in the case where a frequency of a high-frequency power is 1 kHz in the impedance matching device of the above embodiment.

FIG. 4 is an electrostatic capacity table when a number of revolution (N) of the variable capacity capacitor 20 is plotted along the horizontal axis and the electrostatic capacity (C) is plotted along the vertical axis. This number of revolution is a number of revolution on a side where the movable side electrode 26 is deeply inserted into the fixed side electrode 25. Namely, it is a number of revolution on a side where the electrostatic capacity of the variable capacity capacitor 20 increases. In this example, the maximum value of the number of revolution is 4.5 revolutions.

FIG. 4 shows the case where the frequency of the high-frequency power at the time of measurement is 1 kHz. A capacity of the variable capacity capacitor 20 in the state that the movable side electrode 26 is pulled out the fixed side electrode 25 maximally is $5.0 \times 10^{-12}$ farad. The capacity abruptly increases up to $32.1 \times 10^{-12}$ farad with 4.5 revolutions of the drive motor 50. In other words, the electrostatic capacity increases by about 6.4 times with the 4.5 revolutions.

FIG. 4 shows the case where the high-frequency power is 1 kHz, but in a high-frequency range, the bellows 30 and wiring in the variable capacity capacitor (vacuum capacitor) 20 have parasitic inductance, and its level cannot be ignored. Further, the capacitor cover 40 which houses the variable capacity capacitor 20 and the wiring have fixed inductance.

Figure 5:
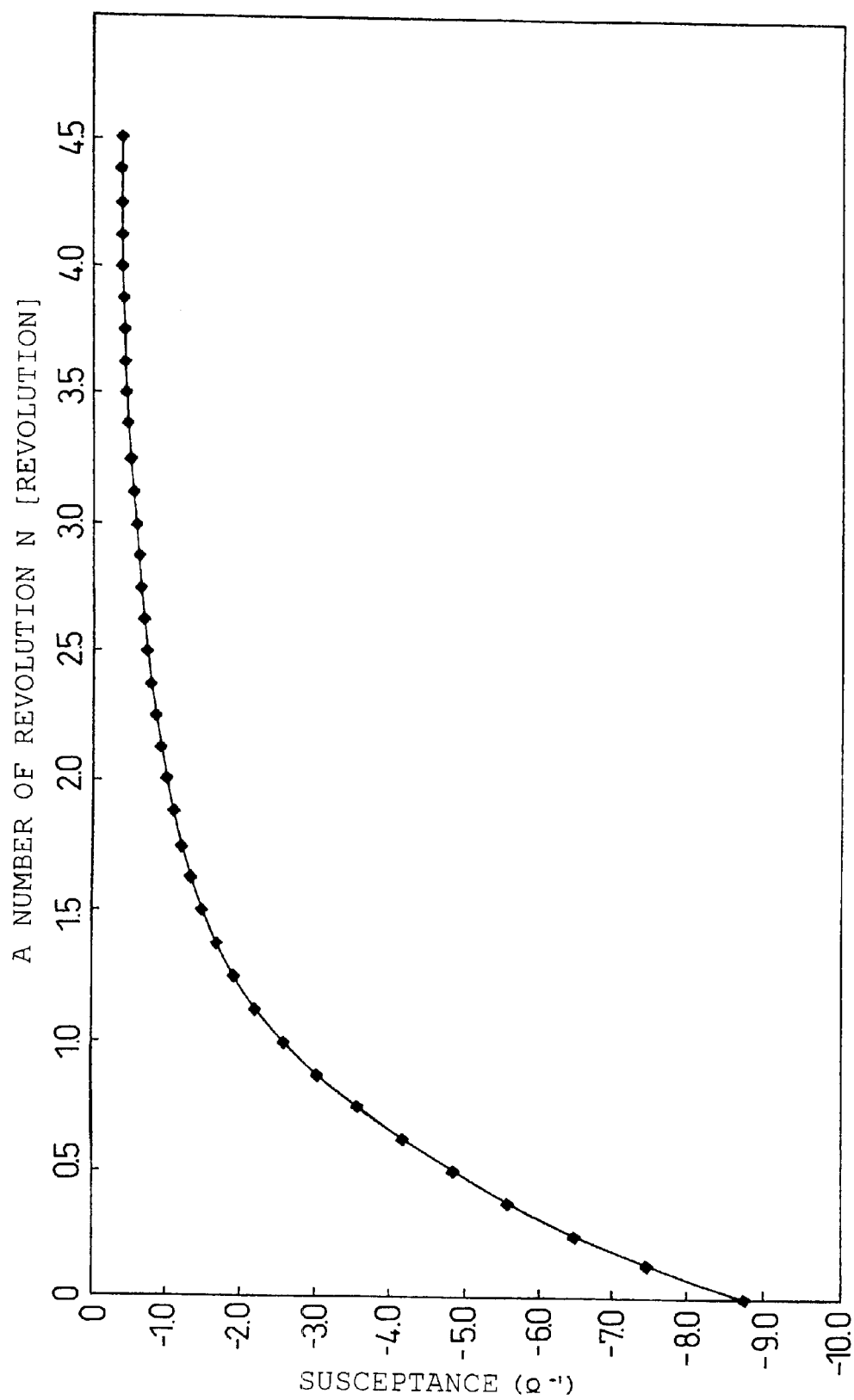
FIG. 5 is a susceptance table showing a relationship between a number of revolution and a susceptance of the variable capacity capacitor in the case where a frequency of the high-frequency power is 450 MHz in the impedance matching device according to the present embodiment.

FIG. 5 is a susceptance table when a number of revolution (N) of the variable capacity capacitor 20 is plotted along the horizontal axis and the susceptance (B) is plotted along the vertical axis. This number of revolution is a number of revolution on the side where the electrostatic capacity of the variable capacity capacitor 20 increases. Namely, it is a number of revolution on the side where the movable side electrode 26 is more deeply inserted into the fixed side electrode 25. In this example, the maximum value of the number of revolution is 4.5 revolutions. A frequency of the high-frequency power at this time is 450 MHz.

As the number of revolution is increased and the electrostatic capacity is increased, the susceptance tends to increase monotonously. Namely, a characteristic curve of monotonous increase without the greatest value and the smallest value is obtained.

When a stub resonates, the stub is damaged or its temperature is raised abnormally. Therefore, it is necessary to prevent the stub from resonating. This requires the above monotonous increase.

When the impedance matching was carried out by using the three stubs 100, 200 and 300, a matchable range obtained a good result such that it almost covers a range where VSWR (Voltage Standing Wave Ratio) on the transmission path is not more than 10.

In the case of an impedance matching device IM of 450 MHz built as a trial, the inductance of the capacitor cover 40 obtains a value in the following manner. A variable range of the used vacuum capacitor is 5.5 to 32.1 pF (see FIG. 4). A normalizing (standardizing) susceptance which is necessary for matching with a load impedance at which VSWR is not more than 10 as a general specification of an impedance matching device is to be considered. When degree of a reflection coefficient Γ is represented by |Γ|, the following formula holds:

$$|\Gamma| = \frac{VSWR - 1}{VSRW + 1} \quad (17)$$

If VSWR=10 is substituted into the above formula, the following formula holds:

$$|\Gamma| = \frac{10 - 1}{10 + 1} \approx 0.818 \quad (18)$$

Therefore, a conductance g and a susceptance b in the normalized admittance y=g+jb becomes as follows:

$$g = \frac{1 - |\Gamma|^2}{1 + 2|\Gamma|\cos\theta + |\Gamma|^2} \quad (19)$$

$$b = \frac{-2|\Gamma|\sin\theta}{1 + 2|\Gamma|\cos\theta + |\Gamma|^2} \quad (20)$$

Where, θ is a phase of the reflection coefficient Γ.

Here, if the conductance g is 1 (g=1), the following formulas hold:

$$\cos\theta \approx -0.818 \quad (21)$$

$$\sin\theta = \pm 0.575 \quad (22)$$

the susceptance b becomes as follows;

$$b = -2.843 \quad (23)$$

Namely, the maximum value of the susceptance b should be not less than 2.843. Here, the minimum value should be as mall as possible, but it is necessary to set it within a range where a withstand voltage and a withstand electric current can be allowed because the value is close to the resonance point.

Therefore, at the time of the minimum electrostatic capacity (5.5 pF) of the vacuum capacitor, when the parasitic inductance of the internal wiring, particularly the bellows 30 in the capacitor is substituted into the following formula, $$L_x = \frac{B_x - \omega C_x}{\omega^2 C_x B_x} \quad (24)$$

the inductance of the capacitor cover 40 obtains the following value:

$$L_x = 0.0165 [\mu H] \quad (25)$$

Figure 6:
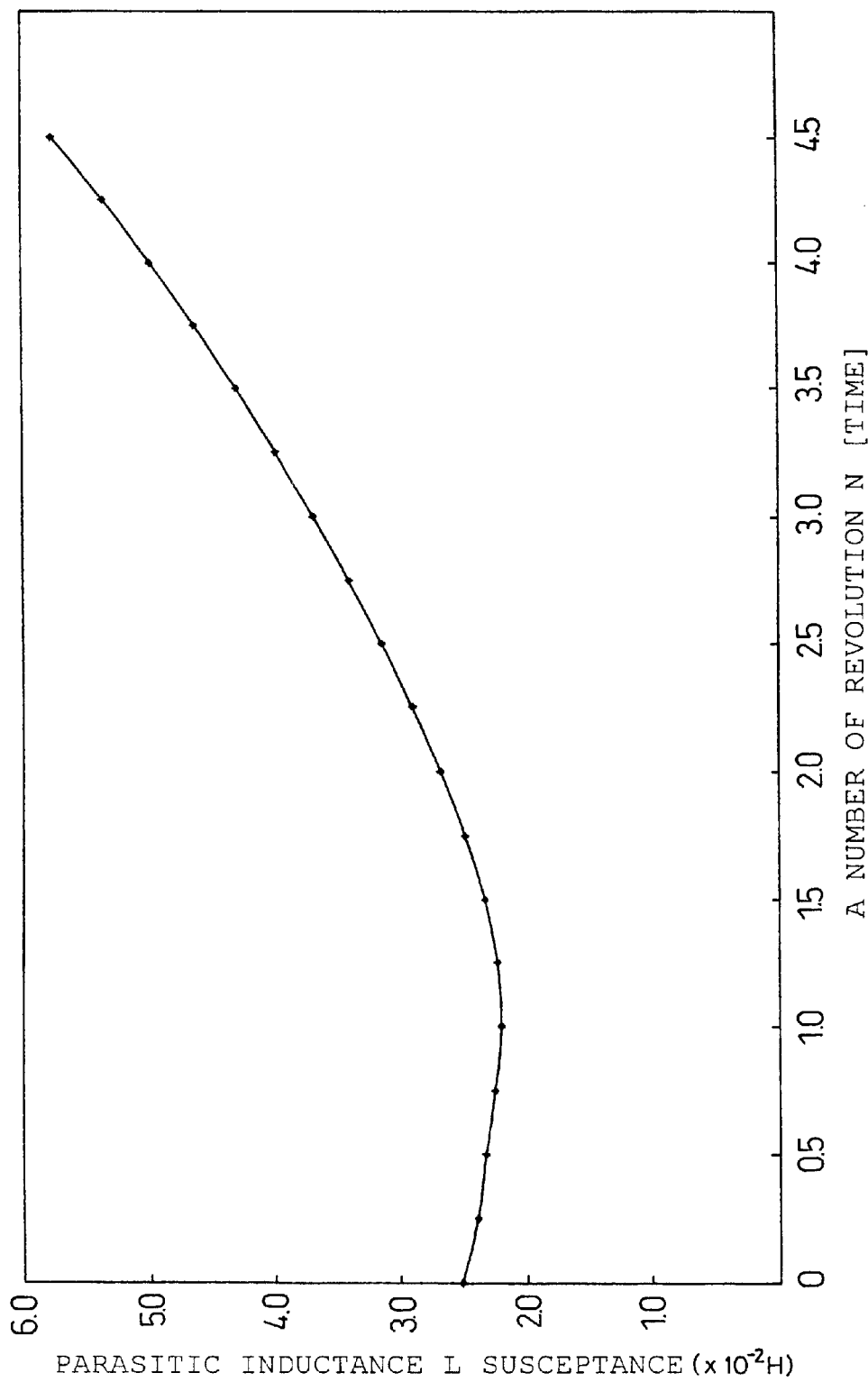
FIG. 6 is a parasitic inductance table showing a relationship between a number of revolution and a parasitic inductance of the variable capacitance capacitor in the case where a frequency of the high-frequency power is 450 MHz in the impedance matching device of the above embodiment.

However, actually due to the the performance of the impedance matching device IM, the inductance having a value not less than 0.0165 μH is required. More concretely, the inductance should be 0.02 μH to 0.06 μH. In other words, as shown in FIG. 6, since the actual parasitic inductance changes with the number of revolution, a value which has been converted into a large one is adopted.

Since the variable capacity capacitor 20 adopts an inward and outward fitting system of the multiplayer composed of the fixed side electrode 25 and the movable side electrode 26, the electrostatic capacity can be changed greatly by comparatively small relative displacement in its axial direction. Therefore, in the impedance matching, the capacitor 20 can exert the high-speed response by means of the rotation of the drive motor 50. The direct connection between the drive motor 50 and the electrostatic capacity adjustment cylinder shaft 29 of the variable capacity capacitor 20 by means of the coupling 52 without reduction is also the factor in providing the high-speed response.

In addition, in the case of the multi-layered inward/outward fitting type variable capacity capacitor 20, an axial length of the stubs 100, 200 and 300 can be shortened to about one in several of an axial length of a normally cylindrically-shaped one of a plunger type capacitor. Therefore, the axial length of the stubs 100, 200 and 300 can be shortened sufficiently, and thus the accuracy of axial center becomes high. This is advantageous to the high-speed response. Moreover, the compact impedance matching device IM can be realized.

Further, since the accuracy of axial center is high, it is not necessary to always limit the axial direction to the vertical direction, and thus the stubs in the horizontal state can be used. When the impedance matching device IM is installed in the state that the stubs 100, 200 and 300 are arranged in the horizontal state, an entire length of the semiconductor production apparatus including piping of the coaxial tube can be shortened. The installation can be developed advantageously. Namely, degrees of freedom of the installation becomes high.

The electrostatic capacity adjustment cylinder shaft 29 is rotated by the rotation of the drive motor 50 via the coupling 52. The adjustment bolt 28 which is screwed into the electrostatic capacity adjustment cylinder shaft 29 slides along the axial direction. In the variable capacity capacitor 20, only screwed portion between the electrostatic capacity adjustment cylinder shaft 29 and the adjustment bolt 28 relatively slides in a contact state. The sliding in the screwed state causes substantially less abrasion. In the long-time use, abrasion and deterioration proceed slowly, and thus the life becomes long. Moreover, such sliding in the screwed state is one factor in the high-speed response.

According to the impedance matching device of the present embodiment, the device follows a behavior of a plasma load at a high speed, and reliability of the plasma dry process is improved, and the impedance matching device can be compact.

In the above embodiment, the three stubs 100, 200 and 300 are provided, but a number of stubs may be two. If so, the impedance matching device can be more compact and can be light weight. Moreover, a number of stubs may be possibly four or more if necessary.

In addition, in the above embodiment, the vacuum capacitor is used as the variable capacity capacitor 20, but alternatively a capacitor in which a susceptance is variable may be used. Examples of such a capacitor is an optimized air gap capacitor or a variable inductor, and the use of them makes it possible to make the impedance matching device more compact and light.

Further, in the above embodiment, the capacitor cover 40 is made of a material such as copper, aluminum or brass, but an insulator may be coated with these materials.

The above explanation can be summarized as follows. According to the present invention, in order to execute the impedance matching for a fluctuation of a load impedance, the electrostatic capacity of the variable capacity capacitor is adjusted. As a result, a moving amount of the movable side electrode in the variable capacity capacitor is less, and thus the frictional resistance is greatly reduced. Moreover, since the variable capacity capacitor is directly driven by the drive motor and the accuracy of axial center is high, the high-speed response of the impedance matching can be realized. Moreover, since the stubs are short and the accuracy of axial center is good, the posture of the stubs is not always limited to the upright posture so that degrees of freedom of the installation such as a laterally laid posture can be widened. Moreover, the entire impedance matching device can be compact. Further, abrasion is less and the long life can be secured.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. An impedance matching device, comprising at least two stubs provided serially on a main coaxial tube to be separated from each other with a predetermined interval in a tube axial direction, said main coaxial tube having an inner conductor and an outer conductor, wherein said each stub comprising:

a variable capacity capacitor whose one end is to be jointed to said inner conductor of said main coaxial tube, said variable capacity capacitor having a movable side electrode and a fixed side electrode;

an electrically conductive capacitor cover to be jointed to said outer conductor of said main coaxial tube so as to be electrically joined to the other end of said variable capacity capacitor as well as to cover a surrounding of said variable capacity capacitor; and a drive motor arranged on an outside of said capacitor cover so as to drive said movable side electrode of said variable capacity capacitor.

2. The impedance matching device according to claim 1, wherein said variable capacity capacitor has cylindrically-shaped movable side electrodes and fixed side electrodes which are inwardly and outwardly fitted into a multilayer.

3. The impedance matching device according to claim 1, wherein said device is designed based on a susceptance of said each stub having said variable capacity capacitor and of said capacitor cover, said susceptance being calculated according to the following formula:

$$Bx = \frac{\omega C_x}{1 - \omega^2 C_x L_x}$$

(where, Bx is the susceptance, Lx is a parasitic inductance, Cx is the electrostatic capacity of said variable capacity capacitor, and ω is a use angular frequency).

* * * * *